United States Patent
Ji et al.

(10) Patent No.: US 10,566,393 B2
(45) Date of Patent: Feb. 18, 2020

(54) TRANSPARENT ORGANIC LIGHT EMITTING DIODE DISPLAY HAVING A STRUCTURE FOR COLOR COMPENSATION

(71) Applicant: LG Display Co., Ltd., Seoul (KR)

(72) Inventors: Seokwon Ji, Paju-si (KR); Jongmoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/204,106

(22) Filed: Nov. 29, 2018

(65) Prior Publication Data

US 2019/0172873 A1 Jun. 6, 2019

(30) Foreign Application Priority Data

Dec. 6, 2017 (KR) .................. 10-2017-0166686

(51) Int. Cl.
*H01L 27/32* (2006.01)
*H01L 51/52* (2006.01)
*H01L 51/50* (2006.01)

(52) U.S. Cl.
CPC .......... *H01L 27/322* (2013.01); *H01L 27/326* (2013.01); *H01L 27/3246* (2013.01); *H01L 27/3276* (2013.01); *H01L 51/5012* (2013.01); *H01L 51/5206* (2013.01); *H01L 51/5234* (2013.01); *H01L 51/5237* (2013.01)

(58) Field of Classification Search
CPC .......................... H01L 27/322; H01L 51/5262
See application file for complete search history.

(56) References Cited

U.S. PATENT DOCUMENTS

| | | | |
|---|---|---|---|
| 10,209,406 B2* | 2/2019 | Ji | H01L 51/5281 |
| 2004/0185604 A1* | 9/2004 | Park | H01L 27/12 438/149 |
| 2005/0035353 A1* | 2/2005 | Adachi | H01L 27/12 257/72 |
| 2014/0183479 A1 | 7/2014 | Park et al. | |
| 2017/0125744 A1 | 5/2017 | Kim et al. | |

FOREIGN PATENT DOCUMENTS

| | | |
|---|---|---|
| KR | 10-2014-0085979 A | 7/2014 |
| KR | 10-2015-0054384 A | 5/2015 |
| KR | 10-1702570 B1 | 2/2017 |

* cited by examiner

*Primary Examiner* — Quoc D Hoang
(74) *Attorney, Agent, or Firm* — Morgan, Lewis & Bockius LLP

(57) ABSTRACT

A transparent organic light emitting diode display is disclosed. The transparent organic light emitting diode display includes a substrate, a pixel disposed on the substrate, the pixel including a light-transmitting area and a light-emitting area, an organic light emitting diode disposed in the light-emitting area of the substrate, an encapsulation substrate that is bonded face to face opposite the substrate, a color filter disposed in the encapsulation substrate corresponding to the light-emitting area, and a color compensation layer disposed in the encapsulation substrate corresponding to the light-transmitting area.

9 Claims, 5 Drawing Sheets

TRANSPARENT ORGANIC LIGHT EMITTING DIODE DISPLAY HAVING A STRUCTURE FOR COLOR COMPENSATION

This application claims the benefit of Korean Patent Application No. 10-2017-0166686 filed on Dec. 6, 2017, the entire disclosure of which are hereby incorporated by reference herein for all purposes.

BACKGROUND

Technical Field of the Invention

The present disclosure relates to a transparent organic light emitting diode display, and more particularly, to a transparent organic light emitting diode display having a structure for preventing color change and/or distortion in a transparent state which provides a background situation as it is.

Discussion of the Related Art

Recently, various flat panel display devices capable of reducing weight and volume, which are disadvantages of cathode ray tubes, have been developed. The flat panel display devices may be implemented as a liquid crystal display (LCD), a field emission display (FED), a plasma display panel (PDP), an electroluminescent display, and the like.

An electroluminescent display is classified into an inorganic electroluminescent display and an organic light emitting diode display depending on a material of a light emitting layer, as a self-luminous element that emits light by itself, and has advantages, such as a fast response speed, a high emission efficiency, a high luminance, a wide viewing angle, and the like. Particularly, there is a growing demand for the organic light emitting diode display which is excellent in energy efficiency, has a small leakage current, and is easy to express grayscale by current control.

In particular, the organic light emitting diode display is utilized as a display device having various purposes and functions such as a transparent display in which image information and background are recognized together. However, in a case of a flat panel display device having such a special function, it should have additional unique structural features that are different from conventional organic light emitting diode displays. For example, the transparent display is like transparent glass because it provides only a background when not used. However, due to physical properties of an organic light emitting layer included in the organic light emitting diode display, a light yellow color may be added in a transparent state to change or distort the background color. In the case of the transparent organic light emitting diode display, there is a need for a structural improvement to prevent such color distortion and/or change.

SUMMARY

Accordingly, embodiments of the present disclosure are directed to a transparent organic light emitting diode display that substantially obviates one or more of the problems due to limitations and disadvantages of the related art.

An aspect of the present disclosure is to solve the problems of the related art described above. An object is to provide a transparent flat panel display device capable of observing a background transmitted as it is as a transparent state when not in use and providing a display function when used. Another object of the present disclosure is to provide a transparent organic light emitting diode display in which no distortion occurs in a background color in a transparent state.

To achieve these and other aspects of the inventive concepts, as embodied and broadly described, a transparent organic light emitting diode display comprises a substrate, a pixel disposed on the substrate, the pixel including a light-transmitting area and a light-emitting area, an organic light emitting diode disposed in the light-emitting area of the substrate, an encapsulation substrate that is bonded face to face opposite the substrate, a color filter disposed in the encapsulation substrate corresponding to the light-emitting area, and a color compensation layer disposed in the encapsulation substrate corresponding to the light-transmitting area.

The organic light emitting diode may include an anode electrode, an organic light emitting layer, and a cathode electrode. At least one of the organic light emitting layer and the cathode electrode may be disposed to extend to the light-transmitting area.

The color compensation layer may be formed by alternately stacking two or more inorganic films having different refractive indices.

The color compensation layer may be formed by alternately stacking a plurality of silicon oxide thin films and a plurality of titanium oxide thin films.

The transparent organic light emitting diode display may further include an antireflection layer disposed on an outer surface of the encapsulation substrate corresponding to the light-emitting area.

The transparent organic light emitting diode display may further include a driving element, which is disposed under the organic light emitting diode in the light-emitting area, configured to drive the organic light emitting diode.

The transparent organic light emitting diode display may further include a scan line, a driving current line, and a data line disposed to define the pixel on the substrate. The driving element may include a switching thin film transistor connected between the scan line and the data line and a driving thin film transistor connected between the switching thin film transistor and the organic light emitting diode.

A transparent organic light emitting diode display according to the present disclosure includes a light-emitting area and a light-transmitting area, and displays image information during operation. When not operating, the transparent organic light emitting diode display maintains a transparent state to show a background situation as it is. Also, it can be applied to an augmented reality display device by providing image information associated with the background situation even during operation. The transparent organic light emitting diode display according to the present disclosure further includes a color compensation layer in the light-transmitting area, so that it can observe a normal background situation by compensating for light distorted by an organic material in the light-transmitting area. In addition, the transparent organic light emitting diode display according to the present disclosure has an advantage of reducing cost because it prevents color distortion in a transparent state without attaching an expensive antireflection film.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
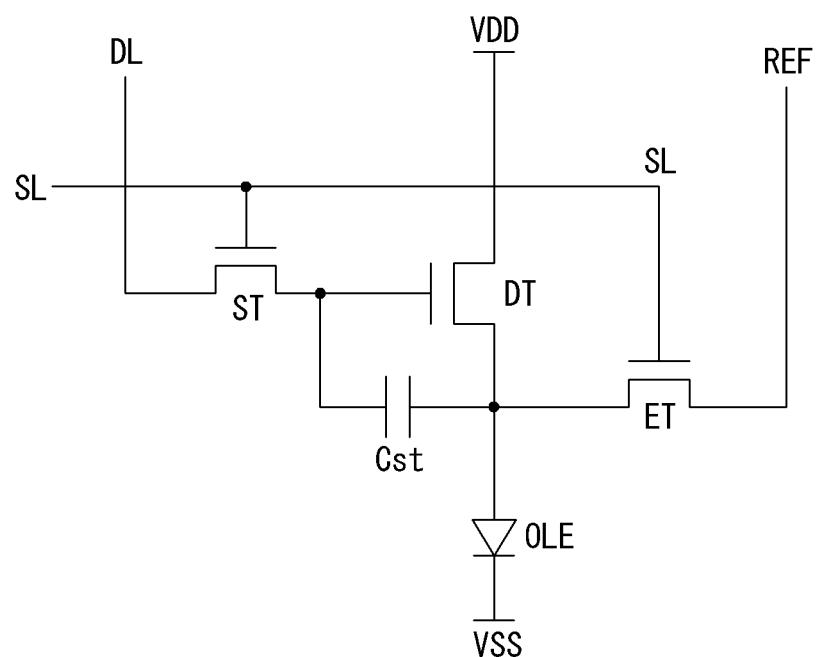
FIG. 1 is an equivalent circuit diagram showing a structure of a pixel in a transparent organic light emitting diode display according to the present disclosure.

Advantages and features of the present disclosure and methods for accomplishing the same will become apparent with reference to embodiments described in detail below with reference to the accompanying drawings. The present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains.

Shapes, sizes, ratios, angles, number, and the like illustrated in the drawings for describing embodiments of the present disclosure are merely exemplary, and the present disclosure is not limited thereto. Like reference numerals designate like elements throughout the description.

In the following description, when a detailed description of well-known functions or configurations related to this document is determined to unnecessarily cloud a gist of the invention, the detailed description thereof will be omitted. In the present disclosure, when the terms "include", "have", "comprised of", etc. are used, other components may be added unless "~only" is used. A singular expression can include a plural expression as long as it does not have an apparently different meaning in context.

In the explanation of components, even if there is no separate description, it is interpreted as including an error range. In the description of position relationship, when a structure is described as being positioned "on or above", "under or below", "next to" another structure, this description should be construed as including a case in which the structures contact each other as well as a case in which a third structure is disposed therebetween.

In the description of the embodiments, the terms "first", "second", etc. may be used to describe various components, but the components are not limited by such terms. These terms are only used to distinguish one component from another component. In addition, the component names used in the following description may be selected in consideration of easiness of specification, and may be different from the part names of actual products.

The features of various embodiments of the present disclosure can be partially combined or entirely combined with each other, and is technically capable of various interlocking and driving. In addition, the embodiments can be independently implemented, or can be implemented in conjunction with each other.

Hereinafter, various embodiments according to the invention will be described in detail with reference to the accompanying drawings. In the following embodiments, an electroluminescent display will be described mainly with respect to an organic light emitting display including an organic light emitting material. However, it should be noted that the technical idea of the present disclosure is not limited to the organic light emitting display, but can also be applied to an inorganic light emitting display including an inorganic light emitting material.

Figure 2:
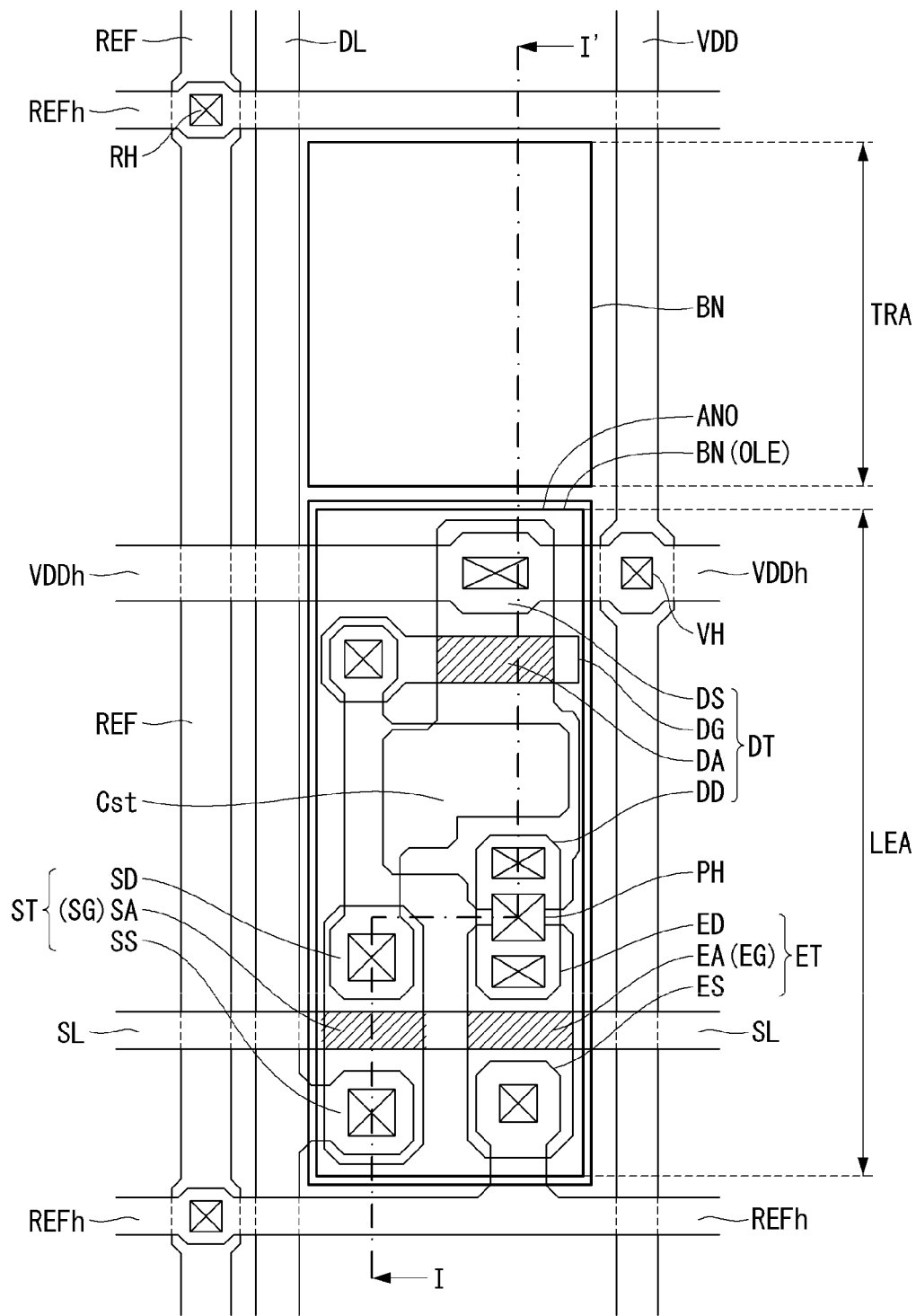
FIG. 2 is a plan view showing a structure of a transparent organic light emitting diode display according to the present disclosure.

Hereinafter, the present disclosure will be described with reference to FIGS. 1 and 2. FIG. 1 is an example of an equivalent circuit diagram showing a structure of a pixel in a transparent organic light emitting diode display according to the present disclosure. FIG. 2 is a plan view showing a structure of a transparent organic light emitting diode display according to the present disclosure.

Referring to FIG. 1, one pixel of the organic light emitting diode display includes a switching thin film transistor ST, a driving thin film transistor DT, an auxiliary capacitor Cst, a compensation circuit, and an organic light emitting diode OLE. The compensation circuit may be configured in various ways. Here, it will be described a case in which a sensing thin film transistor ET and a sensing line REF are provided.

The switching thin film transistor ST performs a switching operation so that a data signal supplied through a data line DL is stored as a data voltage in the auxiliary capacitor Cst in response to a scan signal supplied through a scan line SL. The driving thin film transistor DT operates so that a driving current flows between a power supply line VDD and a base line VSS depending on the data voltage stored in the auxiliary capacitor Cst. The organic light emitting diode OLE emits light depending on the driving current formed by the driving thin film transistor DT.

The sensing thin film transistor ET is a circuit added in the pixel to compensate a threshold voltage of the driving thin film transistor DT and the like. The sensing thin film transistor ET is connected between a drain electrode of the driving thin film transistor DT and an anode electrode of the organic light emitting diode OLE (or a sensing node). The sensing thin film transistor ET operates to supply an initialization voltage (or a sensing voltage) transmitted through the sensing line REF to the sensing node or to sense (detect) a voltage or current of the sensing node.

In the switching thin film transistor ST, a source electrode is connected to the data line DL, and a drain electrode is connected to a gate electrode of the driving thin film transistor DT. In the driving thin film transistor DT, a source electrode is connected to the power supply line VDD and a drain electrode is connected to the anode electrode of the organic light emitting diode OLE. In the auxiliary capacitor Cst, a first electrode is connected to the gate electrode of the driving thin film transistor DT (or the drain electrode of the switching thin film transistor ST), and a second electrode is connected to the anode electrode of the organic light emitting diode OLE.

In the organic light emitting diode OLE, the anode electrode is connected to the drain electrode of the driving thin film transistor DT, and a cathode electrode is connected to the base line VSS. In the sensing transistor ET, a source electrode is connected to the sensing line REF, and a drain electrode is connected to the anode electrode, which is the sensing node, of the organic light emitting diode OLE.

Operation time of the sensing thin film transistor ET may be similar to, the same as or different from that of the switching thin film transistor ST depending on a compensation algorithm. For example, as shown in FIG. 1, a gate electrode of the switching thin film transistor ST and a gate electrode of the sensing thin film transistor ET may be commonly connected to the scan line SL. As another example, while the gate electrode of the switching thin film transistor ST may be connected to the scan line SL, the gate electrode of the sensing thin film transistor ET may be connected to another scan line (not shown).

In addition, a compensation object according to the sensing result may be a digital data signal, an analog data signal, gamma, or the like. The compensation circuit for generating a compensation signal (or a compensation voltage) based on the sensing result may be implemented inside a data driver, inside a timing controller, or as a separate circuit.

Although a pixel of 3T1C (3 transistors, 1 capacitor) structure including the switching thin film transistor ST, the driving thin film transistor DT, the auxiliary capacitor Cst, the organic light emitting diode OLE, and the sensing thin film transistor ET is described as an example in FIG. 1, it may be composed of 3T2C, 4T2C, 5T1C, 6T2C and the like when the compensation circuit is further added.

Hereinafter, with further reference to FIG. 2, structural characteristics of a transparent organic light emitting diode display according to the present disclosure in which the circuit configuration described in FIG. 1 is implemented as a product will be described. FIG. 2 is a view showing an example of a transparent organic light emitting diode display, and may have a different structure from that.

In the transparent organic light emitting diode display according to the present disclosure, a pixel area is defined by a sensing line REF, a data line DL, and a driving current line VDD extending in a vertical direction, and a horizontal sensing line REFh, a horizontal current line VDDh, and a scan line SL extending in a horizontal direction. Specifically, a space between two neighboring horizontal sensing lines REFh and a space between the data line DL and the driving current line VDD may be defined as one pixel area.

The transparent organic light emitting diode display includes a light-transmitting area TRA and a light-emitting area LEA. The light-transmitting area TRA refers to an area through which a background behind the display is transmitted as it is. That is, it is an area that provides the background beyond the display to an observer by transmitting it through the display such as transparent glass. The light-emitting area LEA refers to an area that represents image information provided by the display. In the case of the transparent organic light emitting diode display, the organic light emitting diode OLE is disposed in the light-emitting area LEA.

The scan line SL, the horizontal sensing line REFh, and the horizontal current line VDDh extend in a transverse direction of a substrate. The data line DL, the driving current line VDD and the sensing line REF extend in a longitudinal direction of the substrate. The horizontal sensing line REFh is connected to the sensing line REF extending in the vertical direction through a sensing contact hole RH. The horizontal current line VDDh is connected to the driving current line VDD extending in the vertical direction through a current contact hole VH.

The horizontal current line VDDh and the scan line SL are disposed between the two neighboring horizontal sensing lines REFh. The light-transmitting area TRA is disposed between an upper horizontal sensing line REFh and the horizontal current line VDDh. On the other hand, the light-emitting area LEA is defined between the horizontal current line VDDh and a lower horizontal sensing line REFh. It is desirable that no components are disposed in the light-transmitting area TRA preferably. Even if the components are disposed, it is preferable that transparent components are disposed. The organic light emitting diode OLE, the thin film transistors ST, DT and ET and the auxiliary capacitor Cst are disposed in the light-emitting area LEA. In particular, the organic light emitting diode OLE preferably is formed on the thin film transistors ST, DT, ET and the auxiliary capacitor Cst, and preferably has a top emission type structure for providing light in an upward direction.

The switching thin film transistor ST includes a switching source electrode SS connected to the data line DL, a switching gate electrode SG which is a part of the scan line SL, a switching semiconductor layer SA, and a switching drain electrode SD. An area where the switching semiconductor layer SA and the switching gate electrode SG overlap is a channel area. The switching semiconductor layer SA is disposed across from a lower side to an upper side of the scan line SL, thereby forming the switching thin film transistor ST.

The sensing thin film transistor ET includes a sensing source electrode ES connected to the horizontal sensing line REFh, a sensing gate electrode EG which is a part of the scan line SL, a sensing semiconductor layer EA, and a sensing drain electrode ED. An area where the sensing semiconductor layer EA and the sensing gate electrode EG overlap is a channel area. The sensing semiconductor layer EA is disposed across from a lower side to an upper side of the scan line SL, thereby forming the sensing thin film transistor ET.

The driving thin film transistor DT includes a driving source electrode DS which is a part of the horizontal current line VDDh, a driving gate electrode DG connected to the switching drain electrode SD, a driving semiconductor layer DA, and a driving drain electrode DD. An area where the driving semiconductor layer DA and the driving gate electrode DG overlap is a channel area. The driving semiconductor layer DA starts from the horizontal current line VDDh and extends in the direction of the scanning line SL across the driving gate electrode DG. The driving drain electrode DD is connected to one side of the driving semiconductor layer DA and one side of the sensing semiconductor layer EA.

The auxiliary capacitor Cst includes the first electrode and the second electrode. The first electrode is formed by extending a part of the switching drain electrode SD. The second electrode is formed as a part of the driving semiconductor layer DA extending in the direction of the scan line SL beyond the driving gate electrode DG. The driving thin film transistor DT and the auxiliary capacitor Cst are disposed between the horizontal current line VDDh and the scan line SL.

The anode electrode ANO of the organic light emitting diode OLE is connected to the driving drain electrode DG through a pixel contact hole PH. It is preferable that the anode electrode ANO is disposed so as to occupy most of the light-emitting area LEA and not disposed in the light-transmitting area TRA. It is preferable that the anode electrode ANO is formed so as to cover a maximum area in the light-emitting area LEA. An opening of a bank BN is formed so that a maximum area is exposed from the anode electrode ANO.

Most of the anode electrode ANO is exposed by the bank BN. The organic light emitting diode OLE is formed by stacking an organic light emitting layer and the cathode electrode on the bank BN. It is desirable that there is no component in the light-transmitting area TRA preferably. In an unavoidable case, transparent materials can be disposed.

It is preferable that no organic light emitting diode OLE is formed in the light-transmitting area TRA. Alternatively, at least one of the anode electrode ANO, the organic light emitting layer, and the cathode electrode constituting the organic light emitting diode OLE should not be formed in the light-transmitting area TRA. On the other hand, when only the anode electrode ANO and the cathode electrode are disposed in the light-transmitting area TRA, the two electrodes are short-circuited and cannot function as a display device.

The cathode electrode receives a base voltage of the organic light emitting diode OLE from the base line VSS. The base voltage must maintain a uniform voltage value over an entire area of the display to obtain a constant luminous efficiency. Therefore, it is preferable that the cathode electrode is stacked on the entire area of the display. That is, it is preferable that the cathode electrode is also disposed in the light-transmitting area TRA.

The organic light emitting layer may be stacked or not in the light-transmitting area TRA depending on a manufacturing process. For example, in a case of a transparent organic light emitting diode display using a white organic luminescent material and using a color filter, it is preferable to apply the white organic luminescent material to an entire surface of the display. Therefore, in this case, the organic light emitting layer is also disposed in the light-transmitting area TRA. As another example, in a case of using an organic light emitting layer emitting light of any one of red, green and blue colors, the organic light emitting layer may not be disposed in the light-transmitting area TRA. In this case, only the cathode electrode may be disposed in the light-transmitting area TRA.

Considering all these conditions, it is most preferable that only the cathode electrode is disposed in the light-transmitting area TRA. Alternatively, only the organic light emitting layer and the cathode electrode may be disposed in the light-transmitting area TRA. The transparent organic light emitting diode display includes various elements besides the organic light emitting diodes OLE. In particular, thin films such as insulating films are applied over the entire surface of the display. Therefore, materials such as the insulating film or a planarization film can be stacked on the light-transmitting area TRA, so that it is preferable that these thin films are formed of a transparent material.

First Embodiment

Figure 3:
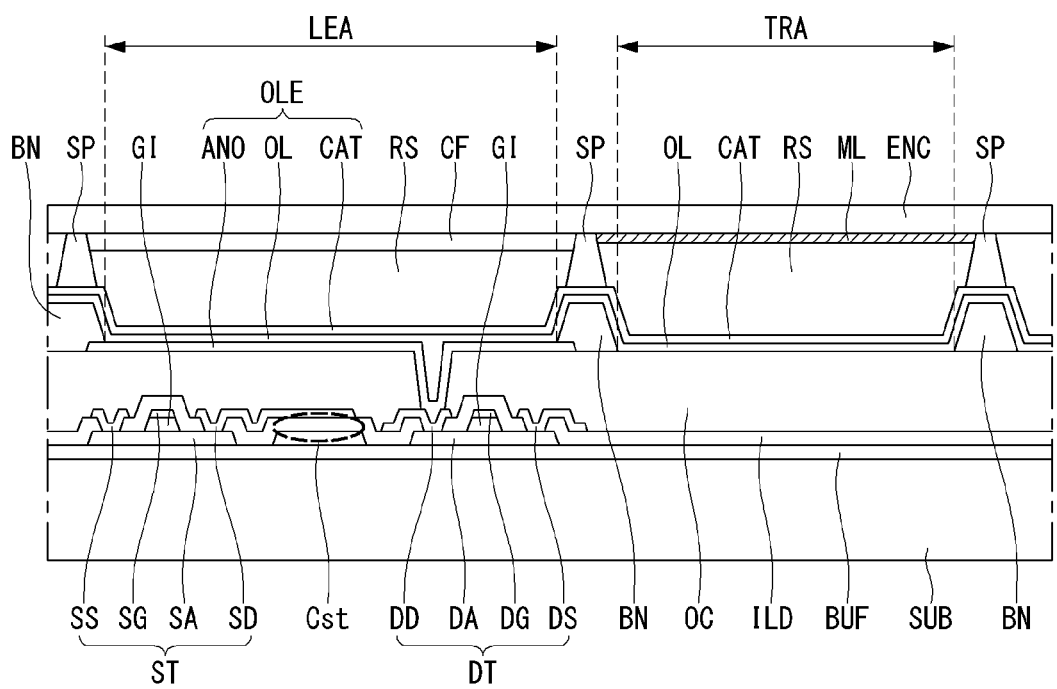
FIG. 3 is a cross-sectional view illustrating a structure of a transparent organic light emitting diode display according to a first embodiment of the present disclosure.

Hereinafter, referring to cross-sectional views, specific embodiments of transparent organic light emitting diode displays according to the present disclosure will be described. First, referring to FIG. 3, a first embodiment will be described. FIG. 3 is a cross-sectional view illustrating a structure of a transparent organic light emitting diode display according to a first embodiment of the present disclosure.

In the transparent organic light emitting diode display according to the first embodiment of the present disclosure, a plurality of pixels are arranged in a matrix manner on a substrate SUB. In a cross-sectional structure, a buffer layer BUF is stacked on the substrate SUB. A switching semiconductor layer SA of a switching thin film transistor ST and a driving semiconductor layer DA of a driving thin film transistor DT are formed on the buffer layer BUF.

A switching gate electrode SG overlapping with the switching semiconductor layer SA is formed with a gate insulating film GI interposed therebetween on a central part of the switching semiconductor layer SA. A driving gate electrode DG overlapping with the driving semiconductor layer DA is formed with the gate insulating film GI interposed therebetween on a central part of the driving semiconductor layer DA. Although not shown in the cross-sectional view, a scan line for connecting the switching gate electrode SG is disposed on the gate insulating film GI.

An intermediate insulating film ILD is stacked on the gate electrodes SG and DG and the scan line so as to cover an entire surface of the substrate SUB. A switching source electrode SS, a switching drain electrode SD, a driving source electrode DS and a driving drain electrode DD are formed on the intermediate insulating film ILD. The switching source electrode SS is in contact with one side of the switching semiconductor layer SA. The switching drain electrode SD is in contact with other side of the switching semiconductor layer SA. The one side and the other side of the switching semiconductor layer SA face each other with a channel area, which overlaps with the switching gate electrode SG, interposed therebetween. In addition, the driving source electrode DS is in contact with one side of the driving semiconductor layer DA. The driving drain electrode DD is in contact with other side of the driving semiconductor layer DA. The one side and the other side of the driving semiconductor layer DA face each other with a channel area, which overlaps with the driving gate electrode DG, interposed therebetween.

A first auxiliary capacitor electrode formed on the same layer as the semiconductor layers SA, DA is formed under the intermediate insulating film ILD. A second auxiliary capacitor electrode extending from the switching drain electrode SD is formed on the intermediate insulating film ILD. The first auxiliary capacitor electrode and the second auxiliary capacitor electrode overlap each other with the intermediate insulating film ILD interposed therebetween to form the auxiliary capacitor Cst.

A planarization layer OC is stacked on the entire surface of the substrate SUB on which the switching thin film transistor ST, the driving thin film transistor DT and the auxiliary capacitor Cst are formed. An anode electrode ANO is formed on the planarization layer OC. The anode electrode ANO is connected to the driving drain electrode DD through a contact hole formed in the planarization layer OC. The anode electrode ANO is formed over the switching thin film transistor ST, the driving thin film transistor DT, and the auxiliary capacitor Cst.

A bank BN is formed on the surface of a substrate SUB on which the anode electrode ANO is formed. The bank BN has a first opening that opens a part of a central part at the anode electrode ANO. This first opening defines a light-emitting area LEA. The bank BN also has a second opening that opens a light-transmitting area TRA in which no driving elements including an opaque material such as the switching thin film transistor ST, the driving thin film transistor DT and the auxiliary capacitor Cst are formed.

An organic light emitting layer OL and a cathode electrode CAT are sequentially stacked on the entire surface of the substrate SUB on which the banks BN are formed. In the light-emitting area LEA, an organic light emitting diode OLE in which the anode electrode ANO, the organic light emitting layer OL, and the cathode electrode CAT are stacked is formed. The organic light emitting layer OL and the cathode electrode CAT are stacked on the planarization layer OC in the light-transmitting area TRA.

A spacer SP is formed on the banks BN. An encapsulation substrate ENC is attached on the spacer SP. The encapsulation substrate ENC is a protective film for protecting elements, which are bonded face to face to the substrate SUB, formed on the substrate SUB via a resin material RS. A color filter CF and a color compensation layer ML are formed on an inner surface of the encapsulation substrate ENC. In particular, it is preferable that the color filter CF corresponds to the light-emitting area LEA and the color compensation layer ML corresponds to the light-transmitting area TRA.

The color compensation layer ML is preferably a multilayer thin film in which two inorganic materials having different refractive indices are alternately stacked. For example, it may be a multilayer thin film in which a silicon oxide ($SiO_x$) thin film and a titanium oxide ($TiO_2$) thin film are alternately stacked. More specifically, silicon dioxide ($SiO_2$) thin films having a thickness of 10 to 80 nm and titanium dioxide ($TiO_2$) thin films having a thickness of 5 to 40 nm may be alternately stacked by 4 to 5 layers, respectively.

Second Embodiment

Figure 4:
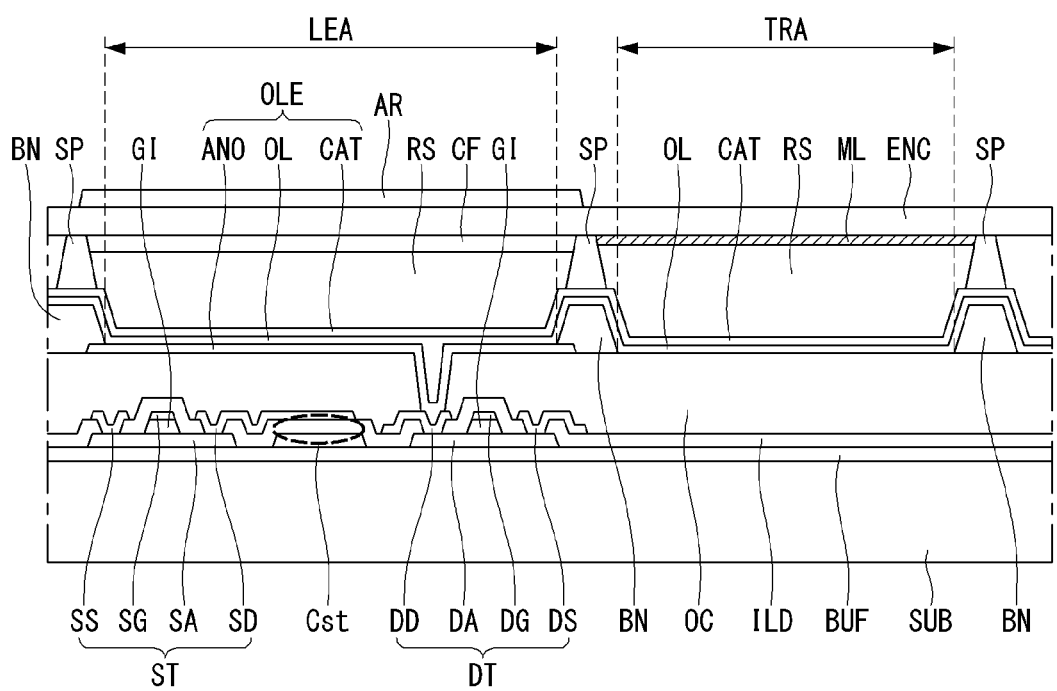
FIG. 4 is a cross-sectional view illustrating a structure of a transparent organic light emitting diode display according to a second embodiment of the present disclosure.

Hereinafter, referring to FIG. 4, a second embodiment of the present disclosure will be described. FIG. 4 is a cross-sectional view illustrating a structure of a transparent organic light emitting diode display according to a second embodiment of the present disclosure.

In a cross-sectional structure of the transparent organic light emitting diode display according to the second embodiment of the present disclosure, a buffer layer BUF is stacked on a substrate SUB. A switching semiconductor layer SA of a switching thin film transistor ST and a driving semiconductor layer DA of a driving thin film transistor DT are formed on the buffer layer BUF.

A switching gate electrode SG overlapping with the switching semiconductor layer SA is formed with a gate insulating film GI interposed therebetween on a central part of the switching semiconductor layer SA. A driving gate electrode DG overlapping with the driving semiconductor layer DA is formed with the gate insulating film GI interposed therebetween on a central part of the driving semiconductor layer DA.

An intermediate insulating film ILD is stacked on the gate electrodes SG and DG so as to cover an entire surface of the substrate SUB. A switching source electrode SS, a switching drain electrode SD, a driving source electrode DS and a driving drain electrode DD are formed on the intermediate insulating film ILD. A first auxiliary capacitor electrode and a second auxiliary capacitor electrode overlap each other with the intermediate insulating film ILD interposed therebetween to form an auxiliary capacitor Cst.

A planarization layer OC is stacked on the entire surface of the substrate SUB on which the switching thin film transistor ST, the driving thin film transistor DT and the auxiliary capacitor Cst are formed. An anode electrode ANO is formed on the planarization layer OC. The anode electrode ANO is connected to the driving drain electrode DD through a contact hole formed in the planarization layer OC. The anode electrode ANO is formed over the switching thin film transistor ST, the driving thin film transistor DT, and the auxiliary capacitor Cst.

A bank BN is formed on the surface of a substrate SUB on which the anode electrode ANO is formed. The bank BN has a first opening that opens most of a central part at the anode electrode ANO. This first opening defines a light-emitting area LEA. The bank BN also has a second opening that opens a light-transmitting area TRA in which no driving elements including an opaque material such as the switching thin film transistor ST, the driving thin film transistor DT and the auxiliary capacitor Cst are formed.

An organic light emitting layer OL and a cathode electrode CAT are sequentially stacked on the entire surface of the substrate SUB on which the banks BN are formed. In the light-emitting area LEA, an organic light emitting diode OLE in which the anode electrode ANO, the organic light emitting layer OL, and the cathode electrode CAT are stacked is formed. The organic light emitting layer OL and the cathode electrode CAT are stacked on the planarization layer OC in the light-transmitting area TRA.

A spacer SP is formed on the banks BN. An encapsulation substrate ENC is attached on the spacer SP. The encapsulation substrate ENC is a protective film for protecting elements, which are bonded face to face to the substrate SUB, formed on the substrate SUB via a resin material RS. A color filter CF and a color compensation layer ML are formed on an inner surface of the encapsulation substrate ENC. In particular, it is preferable that the color filter CF corresponds to the light-emitting area LEA and the color compensation layer ML corresponds to the light-transmitting area TRA.

The color compensation layer ML is preferably a multilayer thin film in which two inorganic materials having different refractive indices are alternately stacked. For example, it may be a multilayer thin film in which a silicon oxide ($SiO_x$) thin film and a titanium oxide ($TiO_2$) thin film are alternately stacked. More specifically, silicon dioxide ($SiO_2$) thin films having a thickness of 10 to 80 nm and titanium dioxide ($TiO_2$) thin films having a thickness of 5 to 40 nm may be alternately stacked by 4 to 5 layers, respectively.

As described above, a basic structure of the transparent organic light emitting diode display according to the second embodiment of the present disclosure is similar to that of the first embodiment. If there is a difference, an antireflection layer AR is further attached to an outer surface of the encapsulation substrate ENC in the light-emitting area LEA. The antireflection layer AR is a film for solving a problem that external light is reflected so that an observer cannot normally observe normal image information.

Since the image information is not provided in the light-transmitting area TRA, a problem of reflection due to the external light is relatively less than in the light-emitting area LEA. Since the color compensation layer ML is formed in the light-transmitting area TRA and the color compensation layer ML also has some function of preventing reflection, the antireflection layer AR is not necessarily required in the light-transmitting area TRA. Therefore, in the second embodiment of the present disclosure, the antireflection layer AR is selectively attached only to the light-emitting area LEA.

Figure 5:
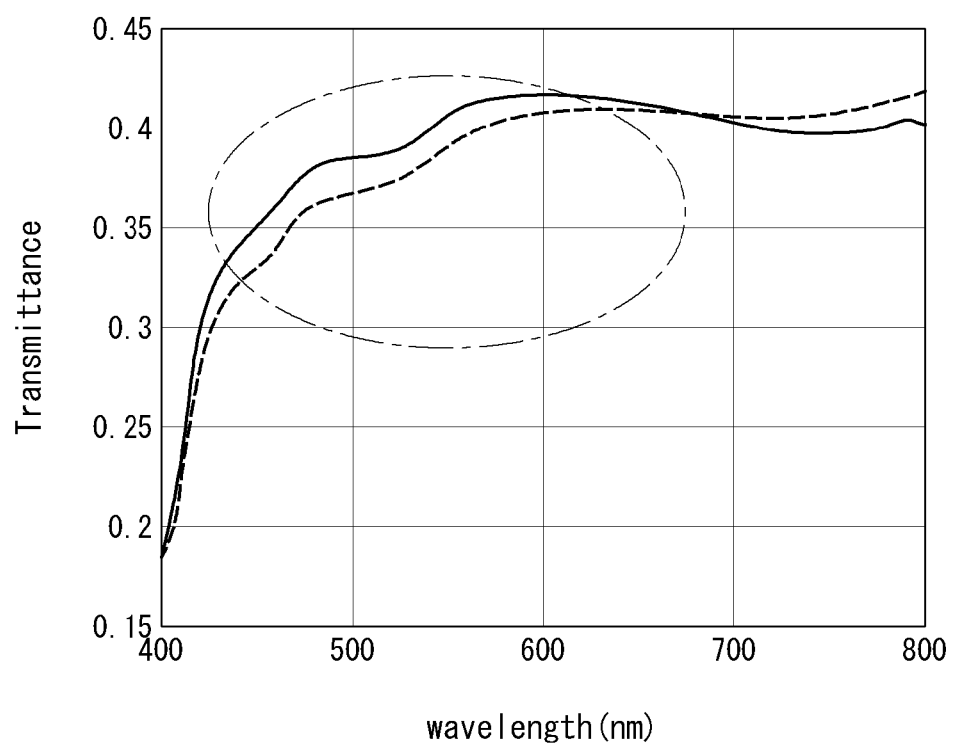
FIG. 5 is a graph illustrating transmittance of wavelength range of light passing through a transparent organic light emitting diode display according to the present disclosure.

Hereinafter, referring to FIG. 5, the color compensation layer ML, which is one of the important components of the present disclosure, will be described in more detail. FIG. 5 is a graph illustrating transmittance of wavelength range of light passing through a transparent organic light emitting diode display according to the present disclosure. The color compensation layer ML of the present disclosure is intended to compensate for an occurrence that light passing through the light-transmitting area TRA is distorted in color by transparent thin films.

For example, in the absence of the color compensation layer ML, light passing through the light-transmitting area TRA passes through the organic light emitting layer OL, the cathode electrode CAT, and the planarization layer OC, the intermediate insulation film ILD, and the buffer layer BUF stacked below. Particularly, the organic light emitting layer OL and the planarization layer OC include organic materials, and light passing through the organic materials tends to have stronger yellow wavelengths.

A curve indicated by a dotted line in FIG. 5 is a curve showing transmittance of wavelength range of light passing through the light-transmitting area TRA without the color compensation layer ML. In the curve indicated by the dotted line in FIG. 5, it can be seen that it shows a low transmittance in a wavelength range of 550 nm or less, while it shows a maximum transmittance in a wavelength range of 550 to 650 nm. This means that the light passing through the light-transmitting area TRA not having the color compensation layer ML has a high yellow transmittance. In fact, when the observer observes background situation through this light-transmitting area TRA, it can be seen that the light is yellowish as a whole.

On the other hand, as in the present disclosure, when the color compensation layer ML is selectively provided in the light-transmitting area TRA, this phenomenon disappears. A curve indicated by a solid line in FIG. 5 is a curve showing transmittance of wavelength range of light passing through the light-transmitting area TRA provided with the color compensation layer ML. In the curve indicated by the solid line in FIG. 5, it can be seen that transmittance of the solid curve is higher than that of the dotted curve in the wavelength range of 550 nm or less. It can also be seen that the transmittance of the solid curve decreases to be less than that of the dotted curve in the wavelength range of 600 to 700 nm. It can be seen that the color compensation layer ML transmits more light of blue wavelength range. In reality, when the observer observes the background situation through the light-transmitting area TRA provided with the color compensation layer ML, the phenomenon of yellowing by the color compensation layer ML disappears, and the color can be normally observed.

That is, the color compensation layer ML applied to the transparent organic light emitting diode display according to the present disclosure compensates for a shift of transmittance to a specific wavelength range by an organic material such as the organic light emitting layer OL and the planarization layer OC. That is, the wavelength range in a color compensation relationship with respect to the wavelength range strengthened by the organic material is reversed to provide a normal color.

It will be apparent to those skilled in the art that various modifications and variations can be made in the transparent organic light emitting diode display of the present disclosure without departing from the technical idea or scope of the disclosure. Thus, it is intended that the present disclosure cover the modifications and variations of this disclosure provided they come within the scope of the appended claims and their equivalents.

What is claimed is:

1. A transparent organic light emitting diode display, comprising:
    a substrate;
    a pixel disposed on the substrate, the pixel including a light-transmitting area and a light-emitting area;
    an organic light emitting diode disposed in the light-emitting area of the substrate;
    an encapsulation substrate that is bonded face to face opposite the substrate;
    a color filter disposed on a surface of the encapsulation substrate corresponding to the light-emitting area; and
    a color compensation layer disposed on a surface of the encapsulation substrate corresponding to the light-transmitting area,
    wherein the color compensation layer is formed by alternately stacking a plurality of silicon oxide thin films and a plurality of titanium oxide thin films.

2. The transparent organic light emitting diode display of claim 1, wherein the organic light emitting diode includes:
    an anode electrode;
    an organic light emitting layer; and
    a cathode electrode,
    wherein at least one of the organic light emitting layer and the cathode electrode is disposed to extend to the light-transmitting area.

3. The transparent organic light emitting diode display of claim 2, wherein the anode electrode is not disposed in the light-transmitting area.

4. The transparent organic light emitting diode display of claim 2, wherein only the cathode electrode is disposed to extend to the light-transmitting area.

5. The transparent organic light emitting diode display of claim 1, wherein the color compensation layer is formed by alternately stacking two or more inorganic films having different refractive indices.

6. The transparent organic light emitting diode display of claim 1, further comprising:
    an antireflection layer disposed on an outer surface of the encapsulation substrate corresponding to the light-emitting area.

7. The transparent organic light emitting diode display of claim 1, further comprising:
    a driving element, which is disposed under the organic light emitting diode in the light-emitting area, configured to drive the organic light emitting diode.

8. The transparent organic light emitting diode display of claim 7, further comprising:
    a scan line, a driving current line, and a data line disposed to define the pixel on the substrate,
    wherein the driving element includes:
    a switching thin film transistor connected between the scan line and the data line; and
    a driving thin film transistor connected between the switching thin film transistor and the organic light emitting diode.

9. The transparent organic light emitting diode display of claim 8, further comprising:
    an auxiliary capacitor connected with the switching thin film transistor, the driving thin film transistor and the organic light emitting diode.

* * * * *